United States Patent
Vajana et al.

(10) Patent No.: US 6,320,219 B1
(45) Date of Patent: Nov. 20, 2001

(54) MEMORY CELL FOR EEPROM DEVICES AND CORRESPONDING FABRICATING PROCESS

(75) Inventors: Bruno Vajana, Bergamo; Carlo Cremonesi, Vaprio d'Adda; Roberta Bottini, Lissone; Giovanna Dalla Libera, Monza, all of (IT)

(73) Assignee: SGS-Thomson Microelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/576,168

(22) Filed: May 22, 2000

Related U.S. Application Data

(62) Division of application No. 08/996,923, filed on Dec. 23, 1997, now Pat. No. 6,080,626.

(30) Foreign Application Priority Data

Dec. 24, 1996 (IT) .............................. MI96A2741

(51) Int. Cl.[7] ............... H01L 21/8247; H01L 29/788
(52) U.S. Cl. ................ 257/321; 257/316; 438/258; 438/264
(58) Field of Search .................. 438/257–267; 257/315, 316, 321

(56) References Cited

U.S. PATENT DOCUMENTS

| | | | |
|---|---|---|---|
| Re. 35,094 | 11/1995 | Wu et al. | 437/43 |
| 3,914,357 | 10/1975 | Goser et al. | 29/579 |
| 5,081,054 | 1/1992 | Wu et al. | 437/43 |
| 5,411,904 | 5/1995 | Yamauchi et al. | 437/43 |
| 5,491,101 | 2/1996 | Miyamoto et al. | 437/43 |
| 5,501,996 | 3/1996 | Yang et al. | 437/43 |
| 5,510,284 | 4/1996 | Yamauchi | 437/43 |
| 5,518,942 | 5/1996 | Shrivastava | 437/43 |
| 5,527,728 | * 6/1996 | Ghezzi et al. | |
| 5,567,632 | 10/1996 | Nakashiba et al. | 437/35 |
| 5,792,670 | 8/1998 | Pio et al. | 437/43 |
| 5,877,054 | 3/1999 | Yamauchi | 438/264 |
| 5,894,146 | 4/1999 | Pio et al. | 257/319 |

OTHER PUBLICATIONS

R. Bottini, et al.; "Passivation Scheme Impact on Retention of Non Volatile Memory Cells"; *95 IRW Final Report*; pp. 18–21; IEEE 1996.

Yoshikawa, et al.; "An Asymmetrical Lightly Doped Source Cell for Virtual Ground High–Density EPROM's"; *IEEE Transactions on Electron Devices*; vol. 37, No. 4, pp. 1046–1051; Apr. 1990.

* cited by examiner

*Primary Examiner*—Richard Booth
(74) *Attorney, Agent, or Firm*—Jenkens & Gilchrist, P.C.

(57) ABSTRACT

A memory cell of the EEPROM type formed on a semiconductor material substrate having a first conductivity type includes a drain region having a second conductivity type and extending at one side of a gate oxide region which includes a thin tunnel oxide region. The memory cell also includes a region of electric continuity having the second conductivity type, being formed laterally and beneath the thin tunnel oxide region, and partly overlapping the drain region. The region of electric continuity is produced by implantation at a predetermined angle of inclination.

5 Claims, 4 Drawing Sheets

MEMORY CELL FOR EEPROM DEVICES AND CORRESPONDING FABRICATING PROCESS

This application is a divisional of application Ser. No. 08/996,923, filed Dec. 23, 1997 now U.S. Pat. No. 6,080,626.

FIELD OF THE INVENTION

This invention relates to a memory cell for EEPROM devices, in particular devices of the FLOTOX EEPROM type, and to a CMOS process for fabricating it.

BACKGROUND OF THE INVENTION

As is known, there exists a demand from the market for EEPROM memory devices of ever larger capacity (>256 Kb), which implies a demand for physically ever smaller memory cells.

Memory devices of the FLOTOX EEPROM type are presently the most widely employed memory devices by manufacturers throughout the world. These devices, while being advantageous from several aspects, have some limitations in layout, due to their operation physics, which disallows reductions in the dimensions of the individual cells below a certain minimum. In particular, memory devices of the FLOTOX EEPROM type are formed of floating-gate memory cells with two levels of polysilicon, wherein an electric charge is stored to establish two different cell states, "written" or "erased", which correspond to the logic states of "1" or "0", respectively.

FIGS. 1 and 2 show the details of a FLOTOX EEPROM type of memory, indicated at 1, which is included in a device 2, itself formed on a semiconductor material substrate 10 having a first conductivity type, specifically of the P type. The device 2 further comprises a select transistor 3 connected in series with the cell 1.

Referring now to FIG. 1, it can be seen that the substrate 10 includes a source region 11 of the cell 1 which has a second conductivity type, specifically of the N type, and a region 12 of electric continuity having the same conductivity type. This substrate also includes a drain region 13 of the cell 1 and a source region of the transistor 3 (the drain/source region 13) having the second conductivity type. This substrate 10 further includes a drain region 14 of the transistor 3, also with the second conductivity type. All the regions indicated at 11–14 are facing a surface 15 of the substrate 10.

With further reference to FIG. 1, in stacked arrangement above the surface 15 are the following: a gate oxide region 18 of the cell 1, at the sides whereof are the source 11 and drain 13 regions of the cell, the region 18 having a thin tunnel oxide region 19 formed therein; a first portion 20 of a first polycrystalline silicon (poly1) layer; a first portion 21 of a dielectric (interpoly) layer; and a first portion 22 of a second (poly2) layer comprised of polycrystalline silicon and tungsten silicide. The portions 20 and 22 form the floating gate region and control gate region, respectively, of the cell 1.

A portion of the substrate 10, indicated at 31 in FIG. 1, is included between the region 12 of electric continuity and the source region 11 of the cell 1 to form the cell channel region having a length dimension denoted by L.

It should be noted that the thin, approximately 80 Å thick, tunnel oxide region 19 is adapted to pass electric charges to the floating gate region by tunnel effect (a phenomenon also known as Fowler-Nordheim current), i.e. for programming the cell 1.

The region 12 of electric continuity, formed laterally and beneath the thin tunnel oxide region 19 and partly overlapping the drain region 13 of the cell 1, provides electric continuity between a region of the substrate 10 underlying the region 19 (the so-called tunnel area) and the drain region 13.

With continued reference to FIG. 1, stacked on top of one another above the surface 15 are: a gate oxide region 25 of the select transistor 3, at the sides whereof there extend the source 13 and drain 14 transistor regions; a second portion 26 of poly; a second portion 27 of the dielectric (interpoly) layer; and a second portion 28 of poly2. The portions 26 and 28 of the polycrystalline silicon layer are shortcircuited to a field oxide region, not shown in the drawings, outside the cell 1. An intermediate oxide layer 30 covers the device 2 and isolates the various layers from one another.

As can be seen in FIG. 2, the floating gate region, portion 20 of poly, of the cell 1 is insulated and enclosed at the top and the sides by the dielectric interpoly layer 21, preferably an ONO layer formed of a superposition of silicon Oxide-silicon Nitride-silicon Oxide, and at the bottom by the gate oxide 18 and tunnel oxide 19 regions.

Still with reference to FIG. 2, the region 12 of electric continuity and the channel region 31 (shown in FIG. 1) are bounded, laterally along their widths, by a thick field oxide layer 32.

Shown in FIG. 3 are the masks employed to form the memory cell 1. In detail, the reference numeral 4 denotes a capacitive implant mask for forming the region 12 of electric continuity, and the reference numeral 5 denotes a tunnel mask for forming the region 19.

Further in FIG. 3, the reference numeral 6 denotes a self-aligned etching mask (to be explained hereinafter), and the reference numeral 7 denotes a drain/source implant mask for forming the drain/source region 13. Finally, the reference numeral 8 denotes a mask for making the drain contact D for the select transistor 3.

The process for fabricating the memory cell 1 is a typical (two- or single-well) CMOS process.

Referring first to FIG. 4, and starting from the substrate 10, the capacitive implant mask 4 is formed after growing the field oxide 32, not shown in the Figure, to bound the active areas of the device 2 and grow a sacrificial oxide layer 39. This mask is formed using a layer 40 of a light-sensitive material fully covering the sacrificial oxide layer 39 but for a window 41 through which the capacitive implantation (usually phosphorus for N-channel cells) will be effected to form the region 12 of electric continuity, as shown in FIG. 5.

Referring now to FIG. 5, after removing the mask 4 and sacrificial oxide layer 39, a gate oxide layer 42 is grown to form the gate oxide region 18 of the cell 1. The tunnel mask 5 is then deposited which comprises a layer 43 of a light-sensitive material fully covering the gate oxide layer 42 but for a window 45 where the thin tunnel oxide region 19 is to be formed.

Thereafter, a dedicated etching is applied to clean the surface 15, which results in the exposed portion of the layer 42 being etched away and the intermediate structure shown in FIG. 5 being produced.

Using the tunnel mask 5, the thin tunnel oxide region 19 is grown which is surrounded by the gate oxide layer 42, as shown in FIG. 6. The tunnel mask 5 is then removed to provide the intermediate pattern shown in FIG. 6.

This is followed by the steps of:

depositing and doping the first (poly1) layer 44 of polycrystalline silicon, as shown in FIG. 7;

shaping layer 44 to delimit the width (along the horizontal direction in FIGS. 1 and 3) of the floating gate region 20 for the cell 1;

depositing the composite ONO (dielectric interpoly 21) layer;

back-etching the ONO layer 21 in the circuitry area of the device 2;

depositing and doping the poly2 layer;

self-alignment etching the poly2, ONO, poly1, and gate oxide 42 layers in the matrix, using the mask 6, to delimit the length (along the vertical direction in FIG. 1) of the floating gate 20 and control gate 22 regions of the cell 1, and simultaneously back-etching the poly2 and poly1 layers in the circuitry area to define the gates of transistors comprising the circuitry;

growing a protecting oxide layer (not shown because embedded within the dielectric layer 30) over the control gate region 22;

optionally effecting a first light drain/source implantation;

forming oxide portions, or spacers, not shown in the drawings, laterally of the floating gate 20 and control gate 22 regions; and effecting a drain/source implantation using the mask 7, to produce the regions 11, 13 and 14, and therefore, the structure shown in FIGS. 1 and 2.

Subsequently, the following conventional final steps are carried out:

forming the intermediate dielectric layer 30 and the contacts, and defining the metal; and depositing the passivation layer.

What is needed is to provide a memory cell for EEPROM devices, specifically of the FLOTOX EEPROM type, and a fabrication process therefor, which can overcome the aforementioned dimensional restrictions besetting the prior art.

SUMMARY OF THE INVENTION

Accordingly, set forth is an EEPROM cell formed on a semiconductor material substrate having a first conductivity type, the memory cell including a drain region having a second conductivity type and extending at one side of a gate oxide region which includes a thin tunnel oxide region. The memory cell further included a region of electric continuity having the second conductivity type, extending laterally and beneath the thin tunnel oxide region, and partly overlapping the drain region, and wherein the region of electric continuity is produced by implantation at a predetermined inclination angle.

The present invention also a process for fabricating an EEPROM cell formed on a semiconductor material substrate having a first conductivity type. The memory cell includes a drain region having a second conductivity type and extending at one side of a gate oxide region which includes a thin tunnel oxide region. The memory cell also includes a region of electric continuity extending laterally and beneath the thin tunnel oxide region and partly overlapping the drain region. The process comprising the steps of depositing a layer of a light-sensitive material having a window onto a sacrificial oxide layer previously deposited onto the substrate to produce a capacitive implant mask, implanting, at a predetermined inclination angle, a dopant through the window, and forming the region of electric continuity.

The present invention also provides an EEPROM memory device formed on a semiconductor material substrate having a first conductivity type. The memory device comprises first and second memory cells symmetrical with each other, each cell including a drain region, having a second conductivity type and extending at one side of a gate oxide region which comprises a thin tunnel oxide region. The first and second cells respectively include a first and a second region of electric continuity, each extending laterally and beneath the thin tunnel oxide region and partly overlapping the drain region. The first and second regions of electric continuity are produced by successive implantations carried out at predetermined angles of inclination.

The present invention also provides a process for fabricating an EEPROM memory device formed on a semiconductor material substrate having a first conductivity type. The memory device comprises first and second memory cells symmetrical with each other, each cell including a drain region having a second conductivity type and extending at one side of a gate oxide region which includes a thin tunnel oxide region. The first and second cells also include respectively a first and second regions of electric continuity each extending laterally and beneath the thin tunnel oxide region and partly overlapping the drain region. The process comprises the steps of depositing a first layer of a light-sensitive material, having a first window on a first portion of a sacrificial oxide layer previously deposited onto the substrate, to produce a first capacitive implant mask, implanting, at a predetermined first inclination angle, a dopant through the first window, depositing a second layer of a light-sensitive material having a second window, on a second portion of a sacrificial oxide layer to produce a second capacitive implant mask, implanting, at a predetermined second inclination angle, the dopant through the second window and forming the first and second regions of electric continuity.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of a cell according to the invention will be apparent from the following description of an embodiment thereof, given by way of non-limitative example with reference to the accompanying drawings.

In the drawings.

DETAILED DESCRIPTION OF A PREFERRED EMBODIMENT OF THE INVENTION

Referring to FIGS. 8–12, generally and schematically shown at 50 is a memory cell for EEPROM devices, specifically of the FLOTOX EEPROM type, which embodies this invention.

Figure 12:
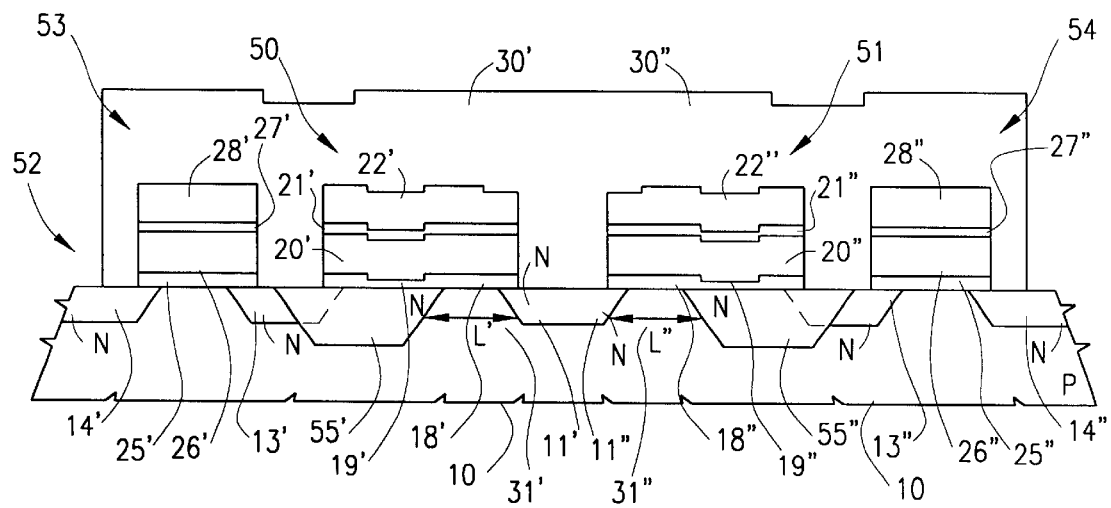
FIG. 12 is a cross-section, similar to FIG. 1, through a memory device including memory cells according to the present invention.

In particular, FIG. 12 shows the memory cell 50, and the memory cell 51 symmetrical therewith, both cells being included in a memory device 52. This device 52 also comprises first 53 and second 54 select transistors which are connected in series with the memory cell 50 and the memory cell 51, respectively.

In the memory device 52, the cells 50, 51 and the select transistors 53, 54 are conventional in design but for the arrangement of the cell regions of electric continuity, which are accordingly indicated at 55' and 55" in FIG. 12.

For the rest, the other parts of the memory device 52, as well as the masks in common with the conventional memory device, carry the same reference numerals as previously used.

In particular, to more clearly discriminate between the two memory cells 50, 51 and the two select transistors 53, 54, the reference numerals of parts relating to the memory cell 50 and the select transistor 53 have been primed ('), and the reference numerals of parts relating to the memory cell 51 and the select transistor 54 have been double-primed (").

In detail, the region 55' of electric continuity related to the memory cell 50 is formed in the substrate 10 by implantation at a predetermined angle of inclination (preferably, of −30 degrees from the normal direction to the plane of the substrate), so as to expand the overlap of the drain region 13' away from the source region 11' of the cell.

In this way, the length L' of the channel region 31' of the cell 50 can be increased as shown in FIG. 12.

The same considerations apply to the formation of the region 55" of electric continuity related to the memory cell 51, excepting that the implantation is here carried out, preferably, at an inclination angle of 30 degrees from the normal to the plane of the substrate because of the cell 51 being symmetrical with the cell 50.

Here again, the region 55" of electric continuity overlaps the drain region 13" farther away from the source region 11" of the cell.

In this way, the length L" of the channel region 31" of the cell 51 is increased as shown in FIG. 12.

As concerns the formation of the memory cells 50 and 51, the process comprises the same initial steps as the conventional process, up to the capacitive implantation.

Figure 3:
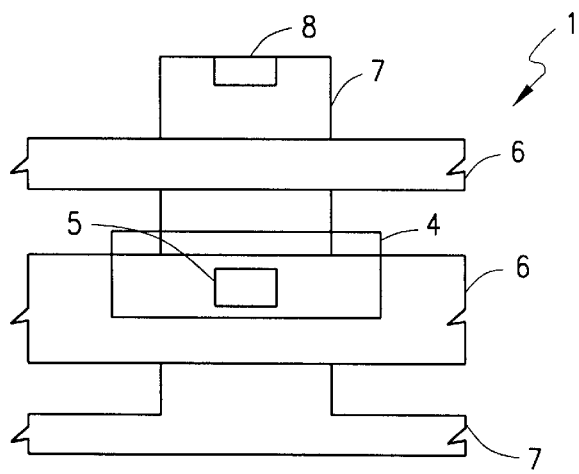
FIG. 3 is a plan view of certain masks used in fabricating an EEPROM cell according to the prior art.
Figure 1:
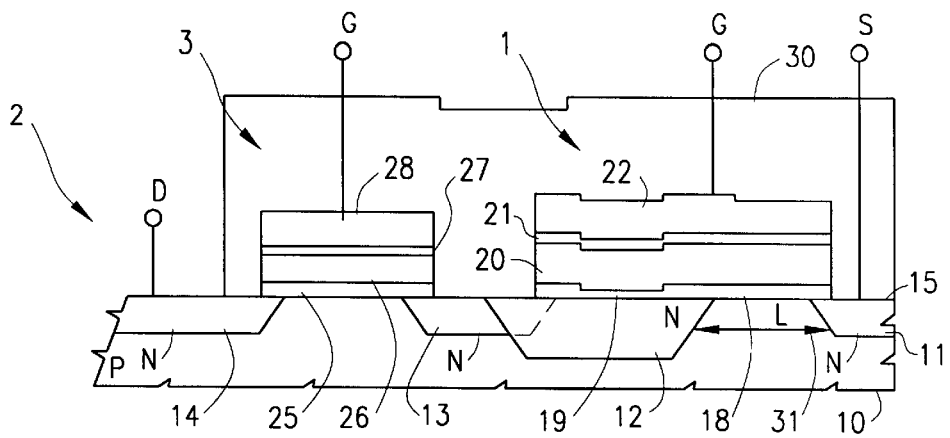
FIG. 1 is a cross-section through a memory device including the prior art cell.
Figure 2:
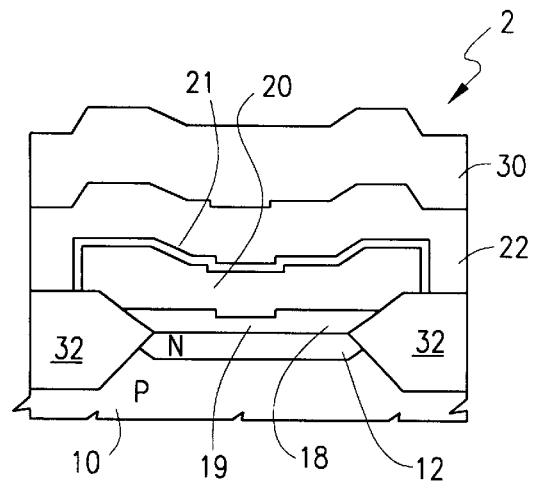
FIG. 2 is a cross-section through the prior art memory cell.
Figure 4:
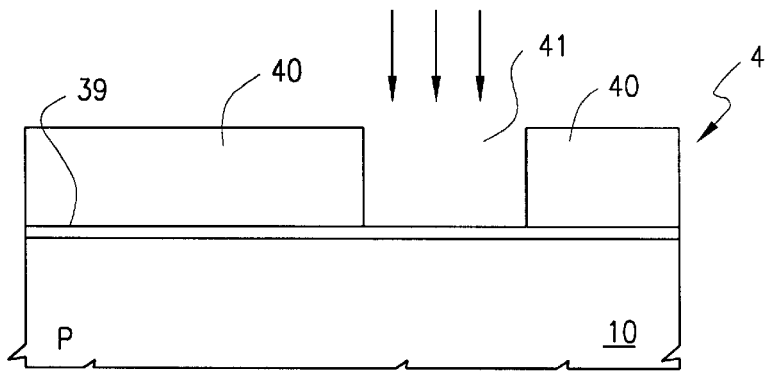
FIGS. 4–7 are cross-sectional views, similar to FIG. 1, of the prior art memory cell at different stages of its fabrication process.
Figure 5:
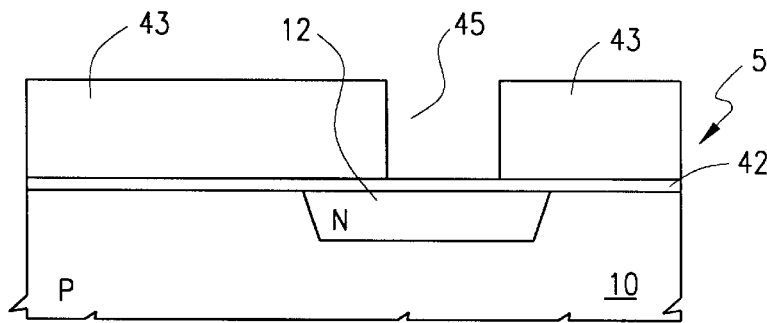
Figure 6:
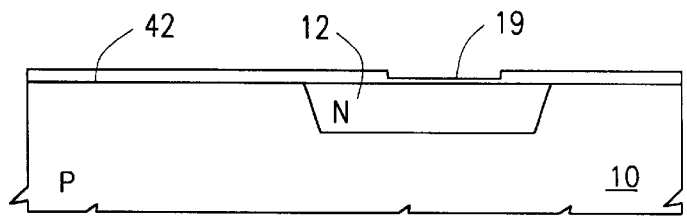
Figure 7:
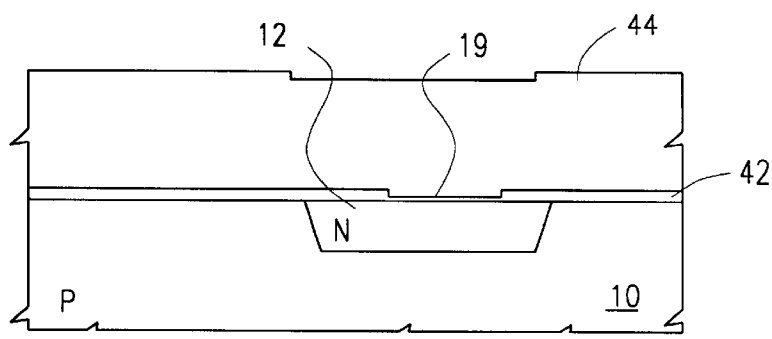
Figure 8:
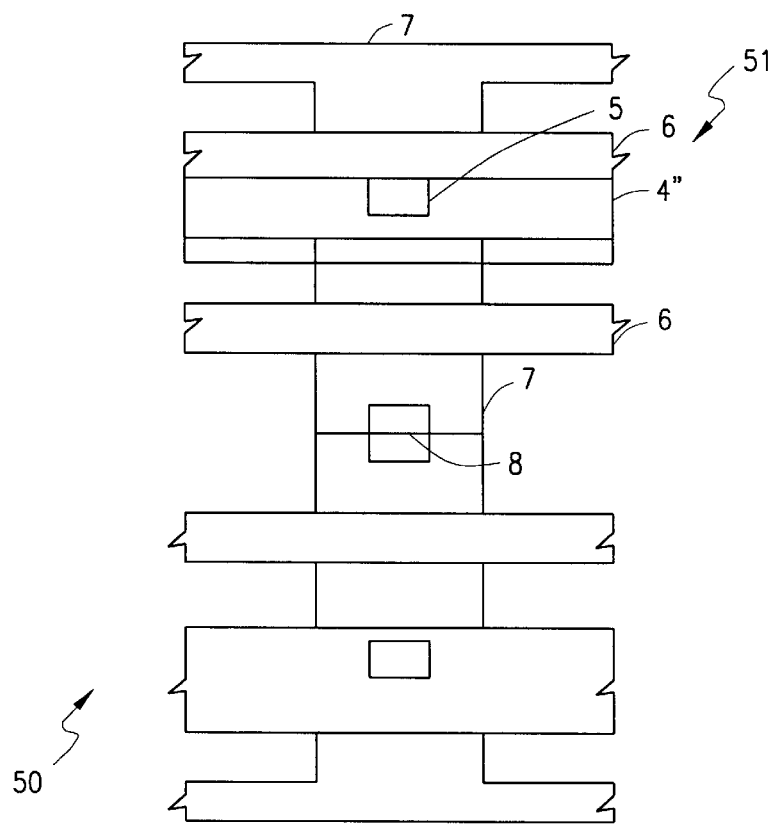
FIGS. 8 and 9 are plan views of certain masks used in fabricating EEPROM cells according to the present invention.
Figure 9:
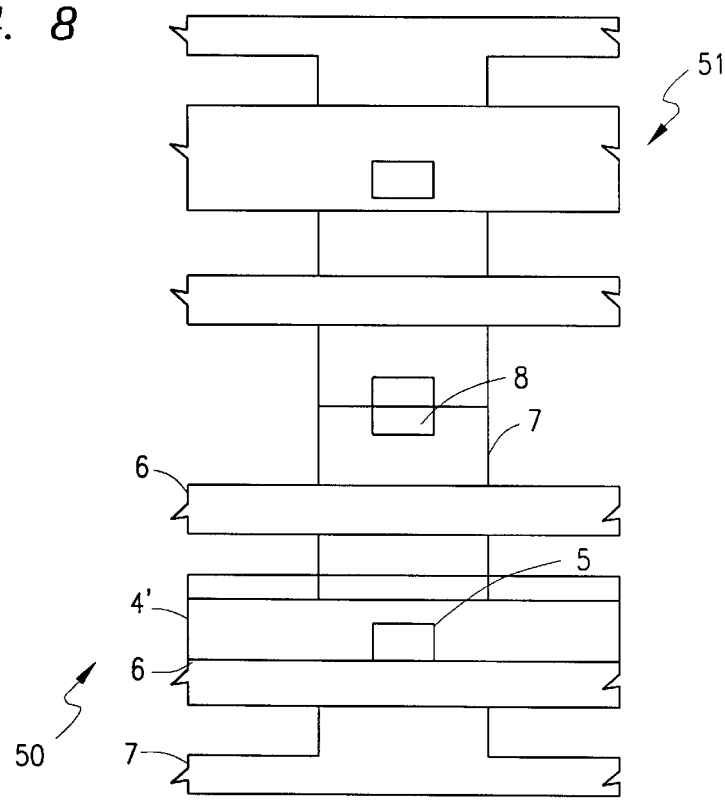
Figure 10:
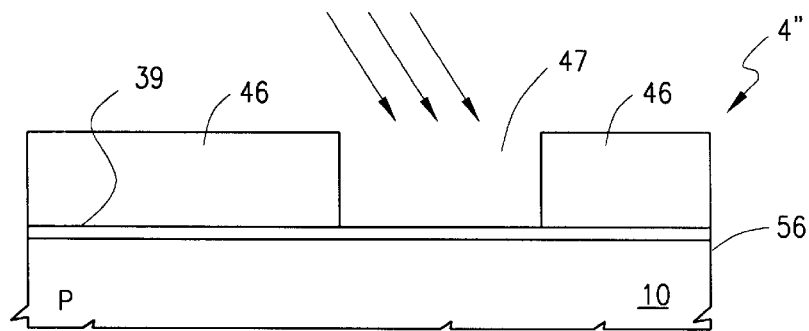
FIGS. 10 and 11 are cross-sectional views, similar to FIG. 1, of memory cells according to the present invention, at a stage of their fabrication process.
Figure 11:
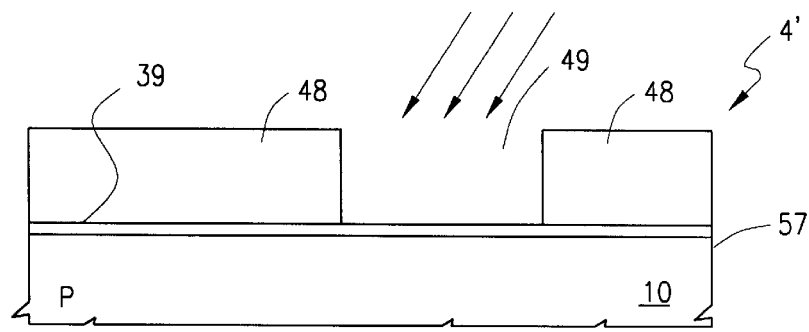

Thereafter, the process of this invention comprises the steps of:

depositing a layer 46 of a light-sensitive material to cover a first portion 56 of the sacrificial oxide layer 39, but for a window 47 (FIG. 10), to produce a capacitive implant mask 4" (FIG. 8);

implanting, at an angle (preferably, a 30-degree inclination angle from the normal to the plane of the substrate), a dopant (usually phosphorus for N-channel cells) through the window 47 (FIG. 10);

depositing a layer 48 of a light-sensitive material to cover the second portion 57 of the sacrificial oxide layer 39, but for a window 49 (FIG. 11), to produce a capacitive implant mask 4' (FIG. 9);

implanting, at an angle (preferably, a −30-degree inclination angle from the normal to the plane of the substrate), a dopant (again phosphorus) through the window 49 (FIG. 11); and forming the regions 55' and 55" of electric continuity.

Thus, cells can be provided which are symmetrical but have increased effective length of the channel region compared to standard length, by virtue of the implantation being carried out at an angle.

In summary, by using an angled implantation method to produce the capacitive implant, the effective length of the cell channel region is increased, since the dopant of the capacitive plant is led away from the edge of the cell control gate.

As a result, the dimensions of the poly in the control gate, and with it the overall size of the cell, can be reduced.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A memory cell formed on a semiconductor material substrate having a first conductivity type, said memory cell including a drain region having a second conductivity type and extending at one side of a gate oxide region which includes a thin tunnel oxide region, and a source region extending from a second side of said gate oxide region, said memory cell further including a region of electric continuity having the second conductivity type, extending laterally and beneath the thin tunnel oxide region, and partly overlapping the drain region of said memory cell, a dopant concentration in said region of electric continuity being greater away from a source region of said memory cell than the dopant concentration in said region of electric continuity closer to said source region.

2. An EEPROM memory device formed on a semiconductor material substrate having a first conductivity type, said memory device comprising first and second memory cells symmetrical with each other, each cell including a drain region, having a second conductivity type and extending at one side of a gate oxide region which comprises a thin tunnel oxide region, said first and second cells respectively including a first and a second region of electric continuity, each extending laterally and beneath the thin tunnel oxide region and partly overlapping the drain region, a dopant concentration in said first region of electric continuity being greater away from a source region of said first memory cell than the dopant concentration in said first region of electric continuity closer to said source region of said first memory cell, and a dopant concentration in said second region of electric continuity being greater away from a source region of said second memory cell than the dopant concentration in said second region of electric continuity closer to said source region of said second memory cell.

3. The device according to claim 2, wherein said first and second regions of electric continuity are produced by successive implantations carried out at predetermined angles of inclination, said predetermined angles of inclination are equal to and opposite from each other.

4. A nonvolatile memory cell, comprising:

a storage device, comprising:

a drain region defined in a semiconductor substrate;

a source region defined in a semiconductor substrate;

a gate oxide region defined over the semiconductor substrate between the drain and source regions, including a relatively thin tunnel oxide region; and a region of electrical continuity having a conductivity type that matches the conductivity type of the drain and source regions, extending under the tunnel oxide region, partially overlapping the drain region, and having a dopant concentration that is greater in the portion of the region of continuity nearest the drain region, relative to the dopant concentration in the portion of the region of continuity nearest the source region; and a select transistor defined substantially within the semiconductor substrate and coupled to the drain region of the storage device.

5. The non-volatile memory cell of claim 4, wherein:

dopant paths of travel in the region of continuity during implantation are angled relative to a surface of the semiconductor substrate.

\* \* \* \* \*

UNITED STATES PATENT AND TRADEMARK OFFICE
CERTIFICATE OF CORRECTION

PATENT NO.    : 6,320,219 B1                                            Page 1 of 1
DATED         : November 20, 2001
INVENTOR(S)   : Vajana et al.

It is certified that error appears in the above-identified patent and that said Letters Patent is hereby corrected as shown below:

Column 2,
Line 11, replace "26 of poly; a second portion 27 of the dielectric (interpoly)" with
-- 26 of poly1; a second portion 27 of the dielectric (interpoly) --
Line 19, replace "20 of poly, of the cell 1 is insulated and enclosed at the top" with
-- 20 of poly1, of the cell 1 is insulated and enclosed at the top --

Signed and Sealed this

Twenty-fifth Day of March, 2003

JAMES E. ROGAN
*Director of the United States Patent and Trademark Office*